(12) United States Patent
Start et al.

(10) Patent No.: US 8,508,040 B2
(45) Date of Patent: Aug. 13, 2013

(54) IN-SITU FOAM MATERIALS AS INTEGRATED HEAT SPREADER (IHS) SEALANT

(75) Inventors: Paul R. Start, Chandler, AZ (US); Rahul N. Manepalli, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 251 days.

(21) Appl. No.: 12/957,738

(22) Filed: Dec. 1, 2010

(65) Prior Publication Data

US 2012/0139093 A1 Jun. 7, 2012

(51) Int. Cl.
*H01L 23/10* (2006.01)
*H01L 23/34* (2006.01)

(52) U.S. Cl.
USPC ............... 257/707; 257/720; 257/E23.092; 257/E23.08

(58) Field of Classification Search
USPC ............... 257/706, 707, 710, 712, 713, 717, 257/720, E23.092, E23.08
See application file for complete search history.

(56) References Cited

U.S. PATENT DOCUMENTS

2009/0214879 A1* 8/2009 Jucker et al. ............... 428/428

* cited by examiner

*Primary Examiner* — Hoai V Pham
(74) *Attorney, Agent, or Firm* — Kevin A. Reif

(57) ABSTRACT

An integrated heat spreader (IHS) lid over a semiconductor die connected to a substrate forms a cavity. A bead of foaming material may be placed within the IHS cavity. During an IHS cure and reflow process the foaming material will expand and fill the IHS cavity and the foam's shape conforms to the various surface features present, encapsulating a thermal interface material (TIM) material, and increasing contact area of the foam sealant.

13 Claims, 6 Drawing Sheets

US 8,508,040 B2

IN-SITU FOAM MATERIALS AS INTEGRATED HEAT SPREADER (IHS) SEALANT

FIELD OF THE INVENTION

Embodiments of the present invention are directed to integrated circuit packages and, more particularly, to thermal solutions for integrated circuit packages.

BACKGROUND INFORMATION

With the advancement of integrated circuit technology, the number of transistors within an integrated circuit has increased exponentially. This increased concentration of transistors has led to a super hot core within the integrated circuit die (die) during integrated circuit operation. With this super hot core, good thermal management is crucial to prevent integrated circuit performance degradation. Typically, various thermal management techniques are employed to ensure that the integrated circuit core temperature is maintained in an acceptable range.

Often times, thermal management of the integrated circuit requires the use of a thermal dissipation device, such as a heatsink to dissipate heat generated by the integrated circuit. A heatsink includes a mass of material thermally coupled to the integrated circuit to conduct thermal energy away from the high-temperature region of the integrated circuit to a low-temperature region of the heatsink. The thermal energy can then be dissipated from a surface of the heatsink to the environment surrounding the heatsink primarily by convection.

An integrated heat spreader (IHS) is typically placed between the integrated circuit and the heatsink. When two solids are placed together, in addition to their respective bulk thermal resistances, there will be thermal interfacial contact resistance between the solids due to the inherent irregularities of the contacting surfaces. For this reason, a first layer of thermal interface material (TIM) is often placed between the integrated heat spreader and the integrated circuit to better wet the interfaces to minimize thermal contact resistance between the integrated circuit and the integrated heat spreader. Likewise a second layer of thermal interface material is placed between the integrated heat spreader and the heatsink. Unfortunately, no matter how well the contact is, there will still be gaps in the interfaces. The current polymer-based and solder-based thermal interface material technology is limited in its ability to meet the heat transfer needs of the ever advancing concentration of transistors in today's integrated circuit.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
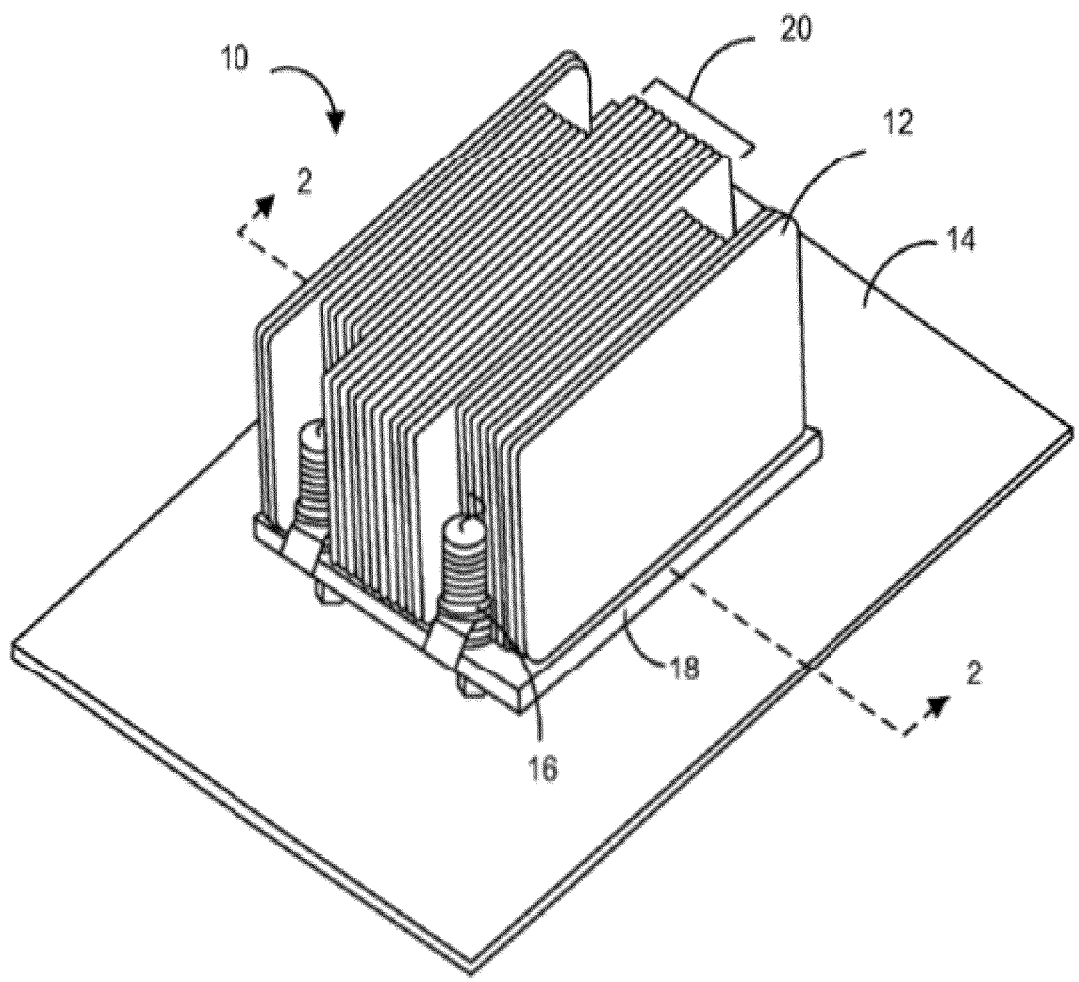
FIG. 1 is a perspective view illustrating an electronic assembly, in accordance with some embodiments of the present invention.

FIG. 1 illustrates a portion of an electronic assembly 10 system, in accordance with one embodiment. The electronic assembly 10 may include a heatsink 12 secured to a substrate 14. The heatsink 12 is positioned over an integrated circuit (not shown) and is in thermal contact with the integrated circuit. A retention mechanism 16 secures the heatsink 12 to the substrate 14. The heatsink 12 may include a base 18 and fins 20 extending from the base 18. The heatsink 12 may be constructed of any suitable thermally conductive materials, according to the requirements of a particular application. Further, the heatsink 12 may be any known or to-be-designed heat dissipation mechanism. In some embodiments of the present invention, the substrate 14 may be a printed circuit board.

Figure 2:
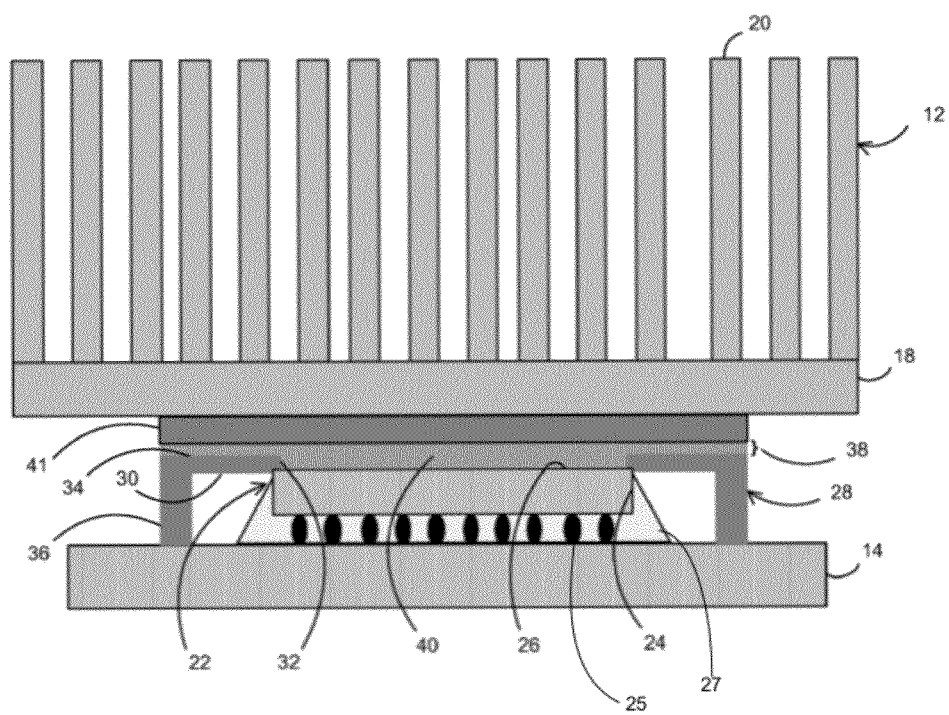
FIG. 2 is a cross sectional view taken along line 2-2 in FIG. 1 illustrating an example electronic assembly, in accordance with an embodiment of the present invention.

FIG. 2 illustrates the example electronic assembly 10, taken along cross-sectional line 2-2 of FIG. 1, in accordance with an embodiment of the present invention. A semiconductor package 22 may be attached to the substrate 14 and may also be electronically joined to the substrate 14. The semiconductor package 22 may include an integrated circuit 24 having a back surface 26 formed thereon. The integrated circuit 24 may be formed in a rectangular piece of semiconductor material called a chip or a die. Examples of the semiconductor material include, but are not limited to silicon, silicon on sapphire, and gallium arsenide. In some embodiments of the present invention, the integrated circuit 24 may be a processor. For example the integrated circuit 24 may be a microprocessor. The semiconductor package 22 may be flip chip connected to the substrate 14 with solder balls 25 and may further include an underfill material 27 located between the substrate 14 and the integrated circuit 24. The underfill material 27 may prevent metal from entering the volume between the device 24 and the substrate 14.

In one embodiment, an integrated heat spreader 28 may be attached to the substrate 14. The integrated heat spreader 28 may be adapted to at most partially cover the integrated circuit 24. The integrated heat spreader 28 may have a substantially cap-like shape, including a ceiling wall 30 having an aperture 32 disposed thereon and an exterior surface 34. The aperture 32 may be adapted to expose the back surface 26 of the integrated circuit 24 at least in part. A plurality of side walls 36 extends from the ceiling wall 30 to the substrate 14 to attach the integrated heat spreader 28 to the substrate 14.

In one embodiment, the aperture 32 of the integrated heat spreader 28 may be adapted to expose less than the entire back surface 26 of the integrated circuit 24. The back surface 26 of the integrated circuit 24 and the exterior surface 34 of the ceiling wall 30 of the integrated heat spreader 28 may be non-coplanar with respect to one another. In this position, the aperture 32 of the integrated heat spreader 28 may be positioned above the back surface 26 of the integrated circuit 24.

The integrated heat spreader 28 may be formed of any suitable material, according to the requirements of the particular application. Examples of materials suitable for forming the integrated heat spreader 28 include, but are not limited to copper or aluminum.

In one embodiment, a metallic layer 38 may be directly placed on the back surface 26 of the integrated circuit 24. The metallic layer 38 may also be directly placed on the exterior surface 34 of the ceiling wall 30 of the integrated heat spreader 28. The metallic layer 38 may include a depressed center region 40. For example, in embodiments where the back surface 26 of the integrated circuit 24 and the exterior surface 34 of the ceiling wall 30 of the integrated heat spreader 28 are non-coplanar with respect to one another, the metallic layer 38 may have a depressed center region 40 at least partially located within the aperture 32 of the integrated heat spreader 28 and positioned above the back surface 26 of the integrated circuit 24. In one embodiment, the heatsink 12 may be thermally coupled to the integrated circuit 24 via the metallic layer 38.

The metallic layer 38 may be formed of any suitable material, according to the requirements of the particular application. Examples of materials suitable for forming the metallic layer 38 include, but are not limited to, copper, nickel, gold or combinations thereof.

In one embodiment, a thermal interface material 41 may be deposited on the metallic layer 38. The thermal interface material 41 is adapted to decrease the thermal resistance in the pathway from the integrated circuit 24. Examples of types of thermal interface materials 41 include, but are not limited to, a thin layer of solder paste, phase-change materials, thermal adhesives (e.g., a highly filled epoxy or acrylic), double-sided thermal tape, and thermal interface pads. In embodiments where thermal interface material 41 is deposited on the metallic layer 38, the heatsink 12 contacts the thermal interface material 41. The heatsink 12 may be thermally coupled to the integrated circuit 24 via the metallic layer 38 as well as via the thermal interface material 41.

The IHS assembly process has a significant impact on a number of package failure modes. Current sealant materials are dispensed at the perimeter of the IHS 28, with a contact area limited by the area of the IHS footprint. The size of this footprint area and it's location are driven by package design considerations that are outside of the IHS control location of dies side components (DSCs), substrate size, use of legacy IHS designs, etc. Embodiments of this invention eliminates or reduces these geometrical constraints. A foaming material may be used to expand and fill the available IHS cavity space increasing contact area of the sealant.

Figure 3A:
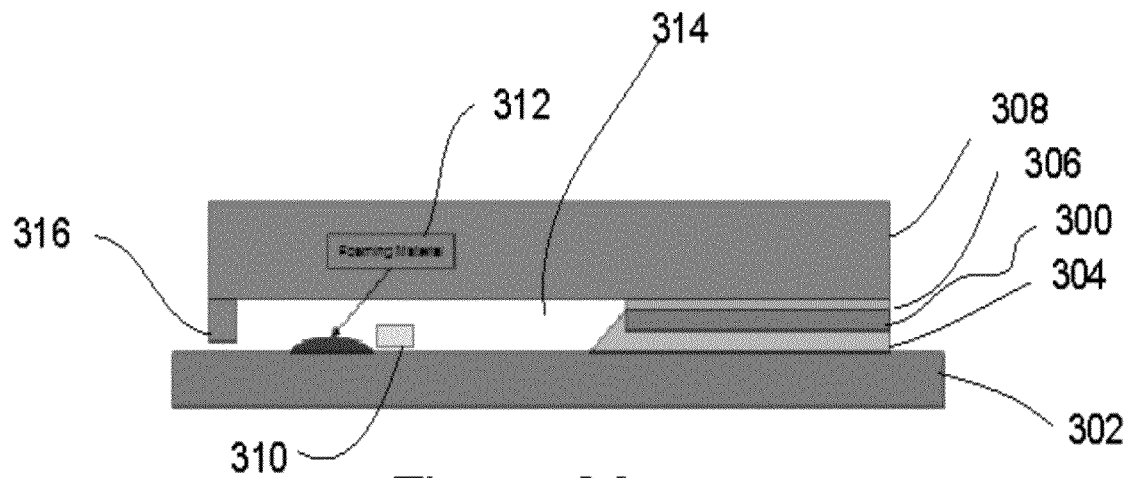
FIGS. 3A-3C shows a process flow for forming an integrated heat spreader (IHS) sealant using an in-situ foaming material according to one embodiment of the invention.
Figure 3B:
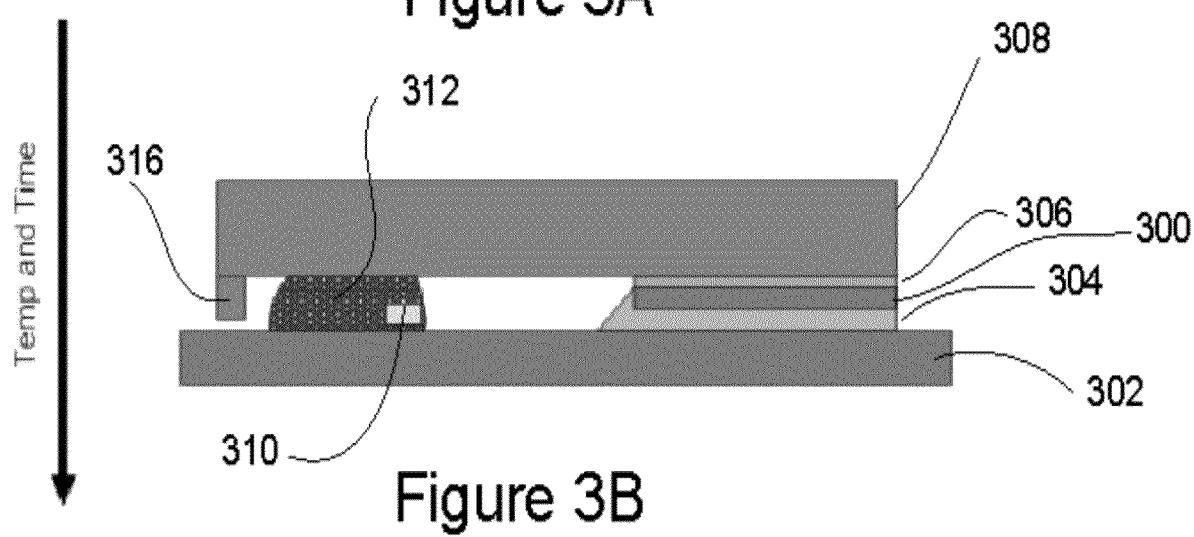
Figure 3C:
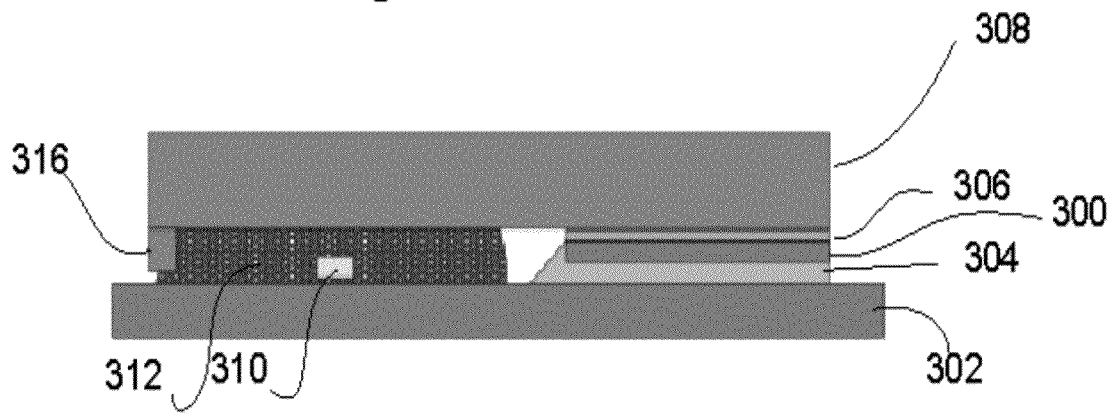

Referring now to FIG. 3A-3C there is illustrated a process flow for forming an integrated heat spreader (IHS) sealant using an in-situ foaming material. Similar to that shown in FIG. 2, an IC chip 300 may be connected to a substrate 302. An underfill material 304 may be present to encapsulate the solder balls (not shown). A thermal interface layer (TIM) 306 may be placed between an integrated heat spreader 308 and the integrated circuit 300 to better wet the interfaces to minimize thermal contact resistance between the integrated circuit 300 and the integrated heat spreader 308. Die side components (DSCs) 310 may also be present. DSCs 310 are optional, and may be, for example decoupling capacitors, or resistors. A bead of foaming material 312 may be placed on the substrate 302 within the IHS cavity 314. As shown in FIG. 3B and FIG. 3C during an IHS cure and reflow process the foam in place sealant material 312 will expand and fill the IHS cavity 314 and the foam's shape may conform to the various surface features present. An optional IHS lip 316 may be present to contain the foam 312 after expansion substantially within the cavity 314.

Figure 4A:
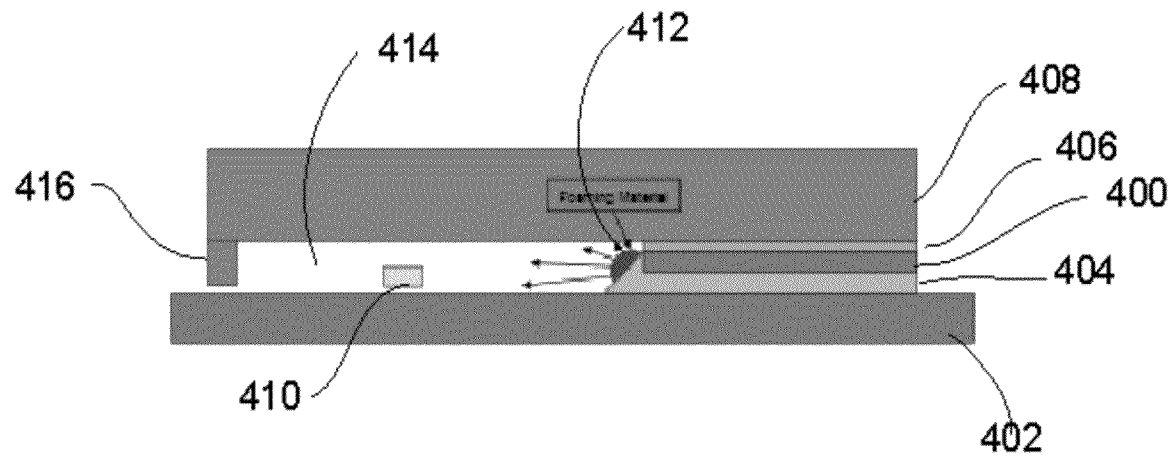
FIGS. 4A-4C shows a process flow for forming an integrated heat spreader (IHS) sealant using an in-situ foaming material according to another embodiment of the invention.
Figure 4B:
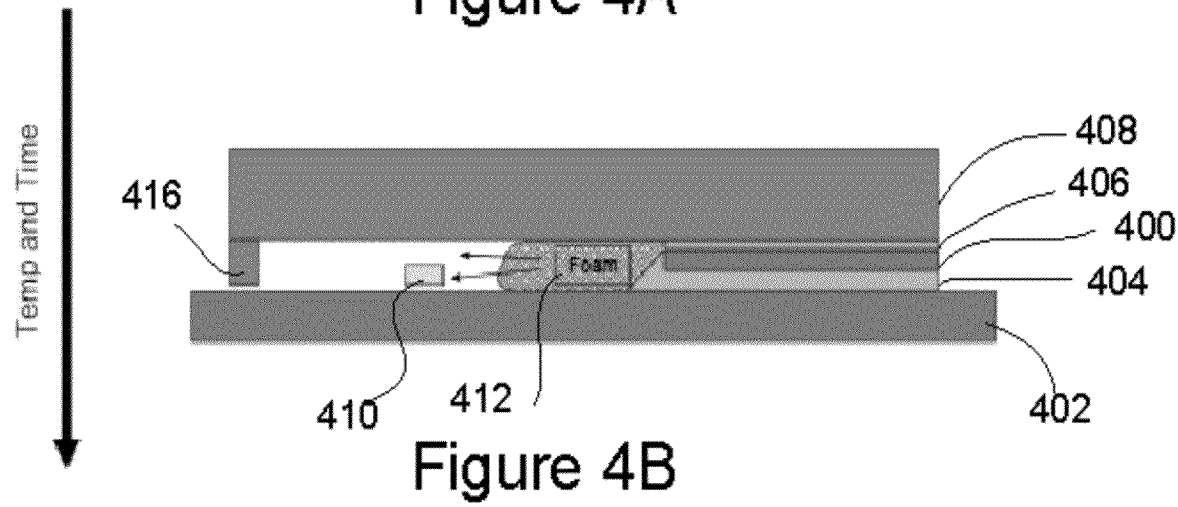
Figure 4C:
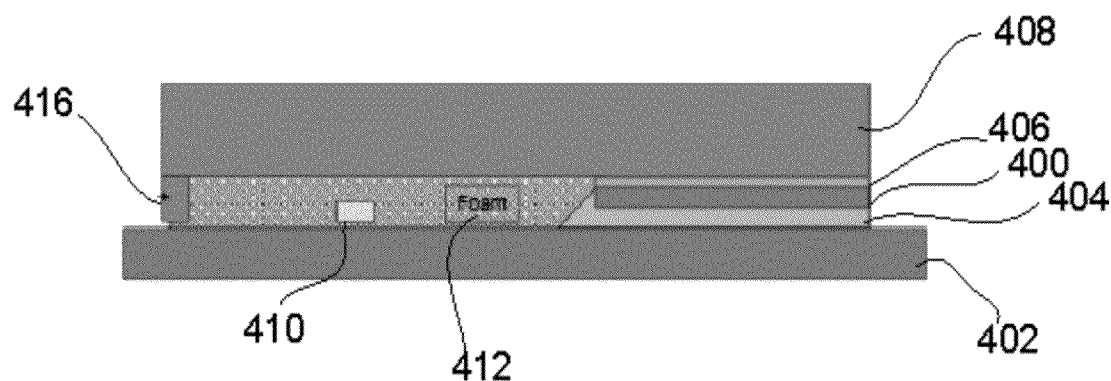

Suitable foam in place materials are commercially available and herein may be used where a seal is needed to conform to the local geometry variations. Dow-Corning 3-8186 Thixotropic Foam is one example of a commercially available silicone based foam useful in embodiments of the invention. Although this material is not used in electronics packaging application, this material will foam, expand, and cure with temperature exposure (~10 minutes at about 75° C.)). In addition to silicone foams, urethane foams, vinyl acetate foams, and other low Tg, foamable polymers may be suitable. The use of either one or two component systems is possible FIGS. 4A-4C show yet another embodiment of the present invention. As before, an IC chip 400 may be connected to a substrate 402. An underfill material 404 may be present to encapsulate the solder balls (not shown). A thermal interface layer (TIM) 406 may be placed between an integrated heat spreader 408 and the integrated circuit 400 to better wet the interfaces to minimize thermal contact resistance between the integrated circuit 400 and the integrated heat spreader 408. Die side components (DSCs) 410 may also be present. DSCs 410 are optional, and may be, for example decoupling capacitors, or resistors. In this embodiment, a bead of foaming material 412 may be placed on the underfill material 404 within the IHS cavity 414.

As shown in FIG. 4B and FIG. 4C during an IHS cure and reflow process the foam in place sealant material will expand and fill the IHS cavity 414 and the foam's shape may conform to the various surface features present, encapsulating the TIM material. An optional IHS lip 416 may be present to contain the foam 412 after expansion substantially within the cavity 414.

Figure 5A:
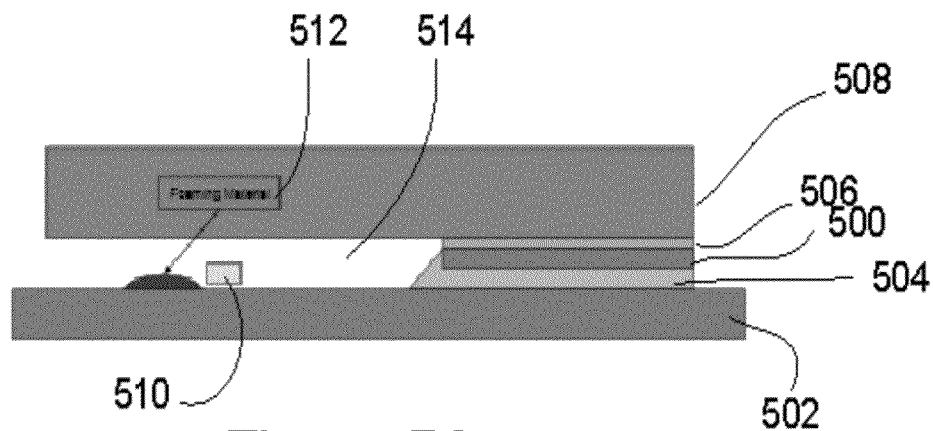
FIGS. 5A-5C shows a process flow for forming an integrated heat spreader (IHS) sealant using an in-situ foaming material according to another embodiment of the invention.
Figure 5B:
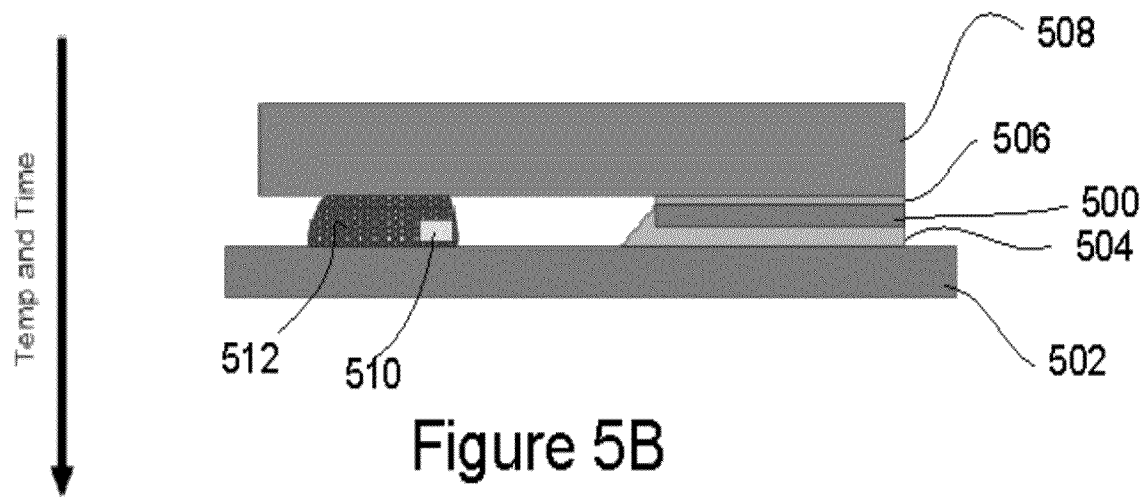
Figure 5C:
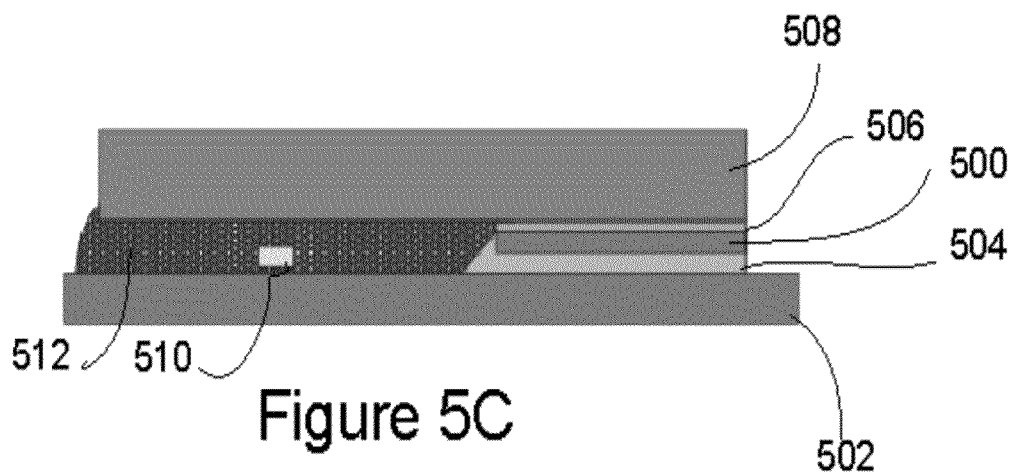

Referring now to FIGS. 5A-5C, there is shown yet another embodiment of the present invention. An IC chip 500 may be connected to a substrate 502. An underfill material 504 may be present to encapsulate the solder balls (not shown). A thermal interface layer (TIM) 506 may be placed between an integrated heat spreader 508 and the integrated circuit 500 to better wet the interfaces to minimize thermal contact resistance between the integrated circuit 500 and the integrated heat spreader 508. Again, die side components (DSCs) 510 may also be present. DSCs 510 are optional, and may be, for example decoupling capacitors, or resistors. A bead of foaming material 512 may be placed on the substrate 502 within the IHS cavity 514. As shown in FIG. 5B and FIG. 5C during an IHS cure and reflow process the foam in place sealant material will expand and fill the IHS cavity 514 and the foam's shape may conform to the various surface features present. In this embodiment the optional IHS lip (shown for example on FIG. 3, 316) is not present. However, the foam material 512 may still be relatively well maintained substantially within the cavity 514 after expansion.

Figure 6A:
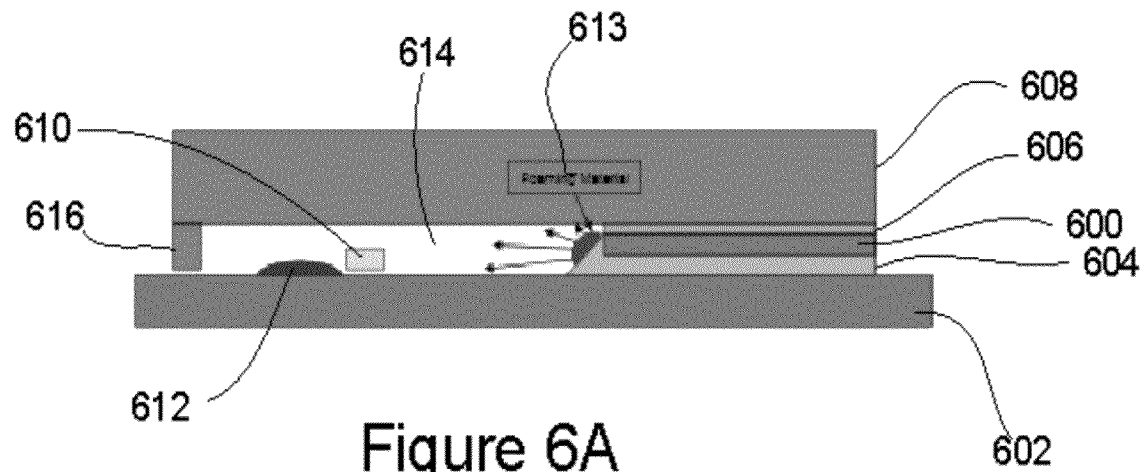
FIGS. 6A-6C shows a process flow for forming an integrated heat spreader (IHS) sealant using an in-situ foaming material according to another embodiment of the invention.
Figure 6B:
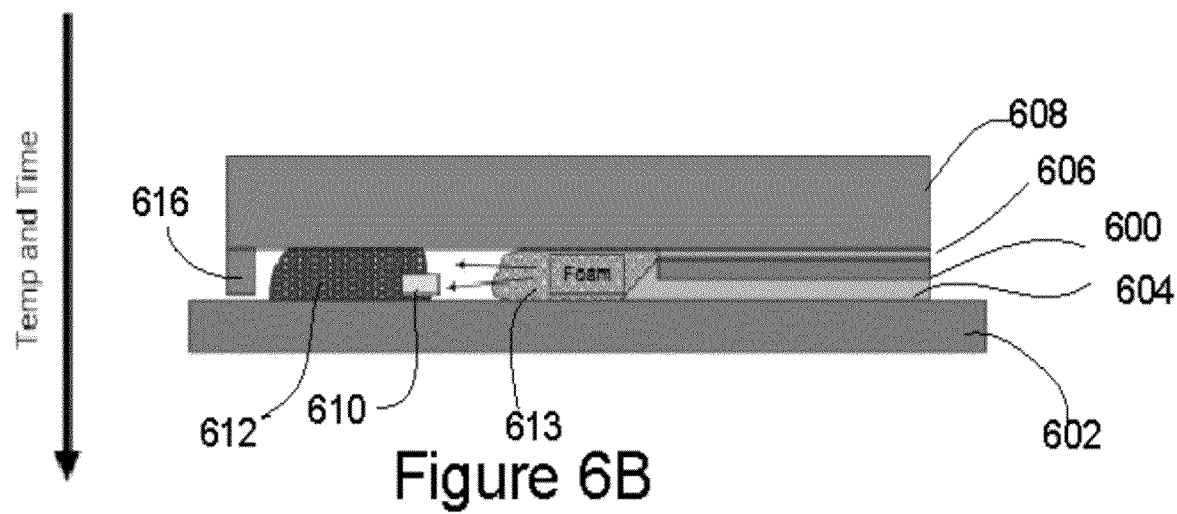
Figure 6C:
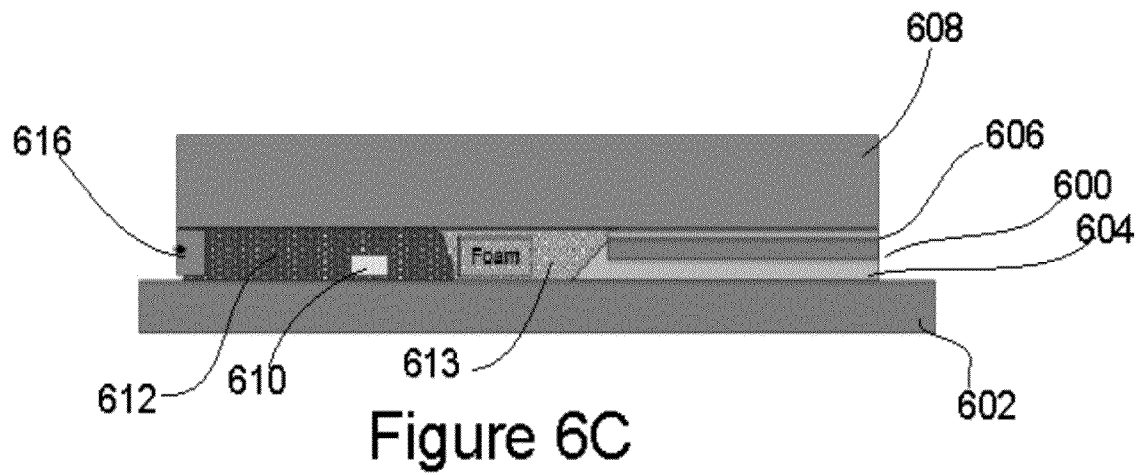

FIGS. 6A-6C show yet another embodiment of the present invention. An IC chip 600 may be connected to a substrate 602. An underfill material 604 may be present to encapsulate the solder balls (not shown). A thermal interface layer (TIM) 606 may be placed between an integrated heat spreader 608 and the integrated circuit 600 to better wet the interfaces to minimize thermal contact resistance between the integrated circuit 600 and the integrated heat spreader 608. Again, die side components (DSCs) 610 may also be present. DSCs 610 are optional, and may be, for example decoupling capacitors, or resistors. In this case, a first bead of foaming material 612 may be placed on the substrate 602 with the IHS cavity 614 and a second bead of foaming material 613 may be placed elsewhere, such as on the underfill 604.

As shown in FIG. 6B and FIG. 6C during an IHS cure and reflow process the foam in place sealant material 612 and 613 will expand and may meet near the middle to fill the IHS cavity 614 such that the foam's shape may conform to the various surface features present. While the first bead would serve to increase sealant contact area, the second bead would serve to encapsulate the TIM material. An optional IHS lip 616 may be present to contain the foam 612 and 613 after expansion substantially within the cavity 614.

Present IHS assembly process may have significant impact on a number of package failure modes. According to embodiments, a foam in place sealant material provides a number of benefits in resolving these issues. First, the foam in place material provides increased contact area between the sealant and the IHS, thus lowering the risk of delamination. Second, the foam in place material would more strongly couple the IHS to the substrate, keeping the TIM material under a more compressive load and prevent thermal degradation. Additionally, the foam materials could act as a gasket around the TIM, preventing pump-out of the TIM material. In addition, the increased contact area of a foam sealant material would provide control of end of line package flatness, without sacrificing thermal reliability. The foam in place sealant would also be constrained to the IHS cavity thus eliminating the IHS keep-out-zones (KOZs) outside of the IHS footprint. Further, the foam in place sealant material would enable a flat IHS. This IHS design would be applicable across multiple die thicknesses.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a semiconductor die disposed on a substrate;
a thermal interface material (TIM) disposed over the semiconductor die;
an integrated heat spreader (IHS) forming a lid over the TIM and the semiconductor die, the IHS forming a cavity between the substrate and the ISH; and
a foamed material substantially filling the cavity.

2. The apparatus as recited in claim 1, wherein the foamed material comprises any one of silicone foams, urethane foams, vinyl acetate foams, and foamable polymers.

3. The apparatus as recited in claim 1 wherein the foamed material substantially conforms to surface features within the cavity.

4. The apparatus as recited in claim 1 further comprising a lip on an edge of the IHS projecting downward towards the substrate to contain the foamed material.

5. The apparatus as recited in claim 1, further comprising die side components (DSCs) within the cavity, the foamed material substantially conforming to the shape of the DSCs.

6. The apparatus are recited in claim 1 further comprising underfill material between the semiconductor die and the substrate.

7. The apparatus as recited in claim 6 wherein the foamed material originated as a bead of unfoamed material placed on either or both of the substrate and the underfill material.

8. A system, comprising:
a semiconductor die electrically connected to a substrate with solder bumps;
an underfill material between the semiconductor die and the substrate encompassing the solder bumps;
a thermal interface material (TIM) disposed over the semiconductor die;
an integrated heat spreader (IHS) forming a lid over the TIM and the semiconductor die, the IHS forming a cavity between the substrate and the ISH;
a heat sink connected to the IHS; and
a foamed material substantially filling the cavity.

9. The system as recited in claim 8 wherein the foaming material comprises any one of silicone foams, urethane foams, vinyl acetate foams, and foamable polymers.

10. The system as recited in claim 8 further comprising die side components (DSCs) within the cavity, the foamed material substantially conforming to the shape of the DSCs.

11. The system as recited in claim 8 further comprising a lip on an edge of the IHS projecting downward towards the substrate to contain the foamed material.

12. The system as recited in claim 8 wherein the foamed material originated as a bead of unfoamed material placed on either or both of the substrate and the underfill material.

13. The system as recited in claim 8 wherein the foamed material originates as a bead of unfoamed material placed on either or both of the substrate and the underfill material.

* * * * *